United States Patent
Yoshihara et al.

(10) Patent No.: US 9,721,875 B2
(45) Date of Patent: Aug. 1, 2017

(54) POWER MODULE AND FABRICATION METHOD FOR THE SAME

(71) Applicant: ROHM CO., LTD., Kyoto-shi, Kyoto (JP)

(72) Inventors: Katsuhiko Yoshihara, Kyoto (JP); Masao Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/003,156

(22) Filed: Jan. 21, 2016

(65) Prior Publication Data

US 2016/0141231 A1 May 19, 2016

Related U.S. Application Data

(63) Continuation of application No. PCT/JP2014/068978, filed on Jul. 17, 2014.

(30) Foreign Application Priority Data

Jul. 22, 2013 (JP) ................................. 2013-151685

(51) Int. Cl.
| | |
|---|---|
| *H01L 23/48* | (2006.01) |
| *H01L 23/495* | (2006.01) |
| *H01L 23/36* | (2006.01) |
| *H01L 21/48* | (2006.01) |
| *H01L 21/56* | (2006.01) |
| *H01L 23/42* | (2006.01) |
| *H01L 23/31* | (2006.01) |

(52) U.S. Cl.
CPC .... *H01L 23/49551* (2013.01); *H01L 21/4842* (2013.01); *H01L 21/563* (2013.01);
(Continued)

(58) Field of Classification Search
CPC .......... H01L 23/49551; H01L 21/4842; H01L 21/563; H01L 23/3107; H01L 23/36; H01L 23/42; H01L 23/49548; H01L 23/49562
See application file for complete search history.

(56) References Cited

U.S. PATENT DOCUMENTS

| | | | |
|---|---|---|---|
| 2008/0122497 A1* | 5/2008 | Ishikawa .............. | H03K 17/567 327/108 |
| 2012/0181679 A1* | 7/2012 | Kadoguchi ......... | H01L 23/3142 257/676 |

(Continued)

FOREIGN PATENT DOCUMENTS

| | | |
|---|---|---|
| JP | 10-93015 | 4/1998 |
| JP | 10-125826 | 5/1998 |

(Continued)

OTHER PUBLICATIONS

International Search Report for PCT/JP2014/068978, dated Aug. 26, 2014 and English language translation, 4 pages total.

(Continued)

*Primary Examiner* — Nicholas Tobergte
(74) *Attorney, Agent, or Firm* — Hamre, Schumann, Mueller & Larson, P.C.

(57) ABSTRACT

A power module includes: an insulating layer; a leadframe disposed on the insulating layer; a semiconductor chip disposed on the leadframe; and a mold resin formed so as to cover the semiconductor chip and at least a part of the metal layer, wherein a groove into which a part of the insulating layer is inserted is formed on a surface of the leadframe facing the insulating layer. Accordingly, there can be provided the power module with improved reliability so that the insulating layer and the leadframe may be hardly deviated from each other even if external force is applied thereon; and a fabrication method for such a power module.

17 Claims, 14 Drawing Sheets

(52) U.S. Cl.
CPC .......... *H01L 23/3135* (2013.01); *H01L 23/36* (2013.01); *H01L 23/42* (2013.01); *H01L 23/49548* (2013.01); *H01L 23/49562* (2013.01); *H01L 23/3107* (2013.01); *H01L 2224/32245* (2013.01); *H01L 2224/48091* (2013.01); *H01L 2224/48247* (2013.01); *H01L 2224/48472* (2013.01); *H01L 2224/73265* (2013.01); *H01L 2924/1305* (2013.01); *H01L 2924/13055* (2013.01); *H01L 2924/13091* (2013.01)

(56) References Cited

U.S. PATENT DOCUMENTS

| | | | | |
|---|---|---|---|---|
| 2012/0188712 | A1* | 7/2012 | Ishibashi | H02M 7/003 361/688 |
| 2013/0063067 | A1* | 3/2013 | Tanaka | H01L 25/07 318/494 |
| 2014/0159054 | A1* | 6/2014 | Otake | H01L 21/566 257/77 |

FOREIGN PATENT DOCUMENTS

| | | |
|---|---|---|
| JP | 2001-57406 | 2/2001 |
| JP | 3201277 | 8/2001 |
| JP | 2002-167560 | 6/2002 |
| JP | 2005-109100 | 4/2005 |
| JP | 2008-153430 | 7/2008 |
| JP | 2008-300379 | 12/2008 |
| JP | 2008300379 A * | 12/2008 |
| JP | 2010-272556 | 12/2010 |
| JP | 2011-100757 | 5/2011 |
| JP | 2011-114010 | 6/2011 |
| JP | 2012-49194 | 3/2012 |
| WO | 2013/105332 | 7/2013 |

OTHER PUBLICATIONS

Extended European Search Report, European Patent Application No. 14829390.5, Feb. 2, 2017 (8 pages).

* cited by examiner

POWER MODULE AND FABRICATION METHOD FOR THE SAME

CROSS REFERENCE TO RELATED APPLICATIONS

This is a continuation application (CA) of PCT Application No. PCT/JP2014/068978, filed on Jul. 17, 2014, which claims priority to Japan Patent Application No. P2013-151685 filed on Jul. 22, 2013 and is based upon and claims the benefit of priority from prior Japanese Patent Applications P2013-151685 filed on Jul. 22, 2013 and PCT Application No. PCT/JP2014/068978, filed on Jul. 17, 2014, the entire contents of each of which are incorporated herein by reference.

FIELD

The embodiment described herein relates to a power module and a fabrication method for such a power module.

BACKGROUND

Conventionally, there have been known power modules in which a power chip including a semiconductor device such as Insulated Gate Bipolar Transistor (IGBT) is mounted on a leadframe therein, and of which the whole system thereof is molded with resin. Since such a semiconductor device produces heat during an operating state, it is common to dispose a heat sink via an insulating layer on a back side surface of the leadframe in order to cool the semiconductor device.

SUMMARY

In conventional power modules, an insulating layer and a leadframe (metal layer) are contacted with each other on a flat surface. If external force is applied thereon in such a state where the insulating layer and the metal layer are contacted with each other on the flat surface, the insulating layer and the metal layer may be deviated (displaced) from each other, thereby causing insulation failure. Moreover, if the insulating layer and the metal layer are deviated from each other and thereby a gap is formed therebetween, a thermal resistance of the module may be increased. Thereby, since it becomes impossible to cool the semiconductor device as designed, there will be generated thermal run away of the semiconductor device, thermal deterioration of bonding layers, e.g. a solder layer, and fusing of bonding wires.

The embodiment provides: a power module with improved reliability so that an insulating layer and a metal layer may be hardly deviated from each other even if external force is applied thereon; and a fabrication method for such a power module.

According to one aspect of the embodiment, there is provided a power module comprising: an insulating layer; a metal layer disposed on the insulating layer; a semiconductor chip disposed on the metal layer; and a mold resin formed so as to cover the semiconductor chip and at least a part of the metal layer, wherein a groove into which apart of the insulating layer is inserted is formed on a surface of the metal layer facing the insulating layer.

According to another aspect of the embodiment, there is provided a fabrication method for a power module comprising: forming a groove on a bottom surface of a leadframe; bonding a semiconductor chip to the leadframe with a conductive bonding material; electrically connecting the semiconductor chip and the leadframe to each other using a connecting member; disposing the leadframe on a metallic mold and then forming an insulating layer on a bottom surface of the leadframe, the insulating layer formed so as to be inserted into the bottom surface of the leadframe; and after curing the insulating layer, closing the metallic mold, and then pouring a mold resin therein in order to mold the leadframe, the conductive bonding material, the semiconductor chip, and the connecting member.

According to still another aspect of the embodiment, there is provided a fabrication method for a power module comprising: forming a groove on a bottom surface of a leadframe; bonding a semiconductor chip to the leadframe with a conductive bonding material; electrically connecting the semiconductor chip and the leadframe to each other using a connecting member; disposing the leadframe on a metallic mold and then forming an insulating layer on a bottom surface of the leadframe; and after curing the insulating layer, closing the metallic mold, and then pouring a mold resin therein in order to mold the leadframe, the conductive bonding material, the semiconductor chip, and the connecting member, wherein the step of forming the insulating layer on the bottom surface of the leadframe comprises forming so that a surface of the mold resin and a surface of the leadframe are flush with each other at a corner portion of the leadframe, and then forming the insulating layer on the surface of the mold resin and the surface of the leadframe which are flush with each other.

According to the embodiment, there can be provided a power module with improved reliability so that the insulating layer and the metal layer may be hardly deviated from each other even if external force is applied thereon; and a fabrication method for such a power module.

DESCRIPTION OF EMBODIMENTS

Figure 1:
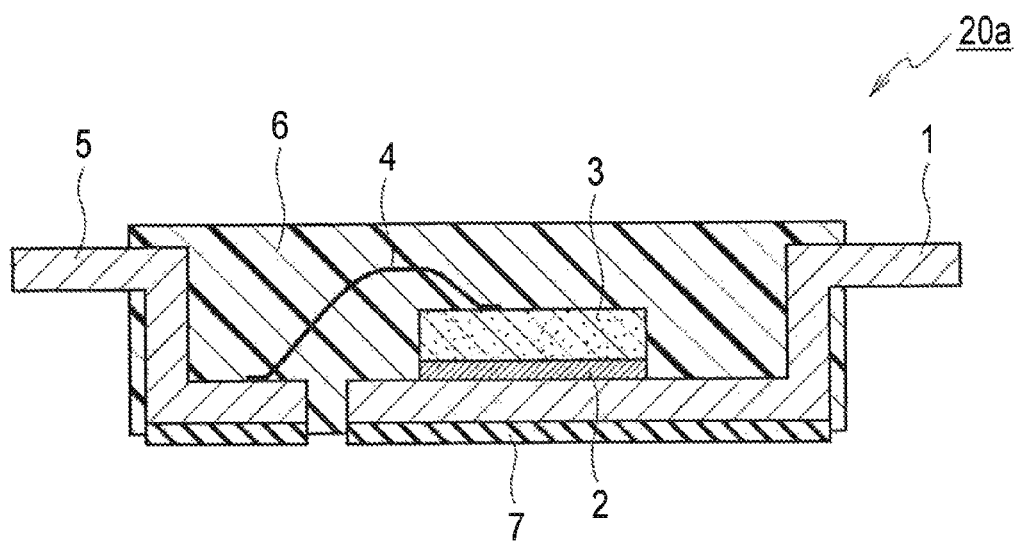
FIG. 1 is a schematic cross-sectional structure diagram of a power module according to a comparative example.

Next, a certain embodiment will be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiment described hereinafter merely exemplifies the device and method for materializing the technical idea; and the embodiment does not specify the material, shape, structure, placement, etc. of each component part as the following. The embodiment may be changed without departing from the spirit or scope of claims.

(Comparative Example)

A schematic cross-sectional structure of a power module 20a according to a comparative example is illustrated as shown in FIG. 1. As shown in FIG. 1, firstly, a semiconductor chip 3 is bonded with a solder 2 on a leadframe 1. Subsequently, the semiconductor chip 3 and a leadframe 5 are electrically connected to each other with an aluminum wire 4. Subsequently, the leadframe 1 and the leadframe 5 are disposed on a metallic mold (not shown), and an insulating layer 7 is formed on a surface of the leadframes 1 and 5 (hereafter referred to as a "bottom surface") opposite to a surface on which the semiconductor chip 3 is mounted. Subsequently, the metallic mold is closed and then a mold resin 6 is poured therein, and thereby the power module 20a molded with the mold resin 6 can be formed.

Figure 2:
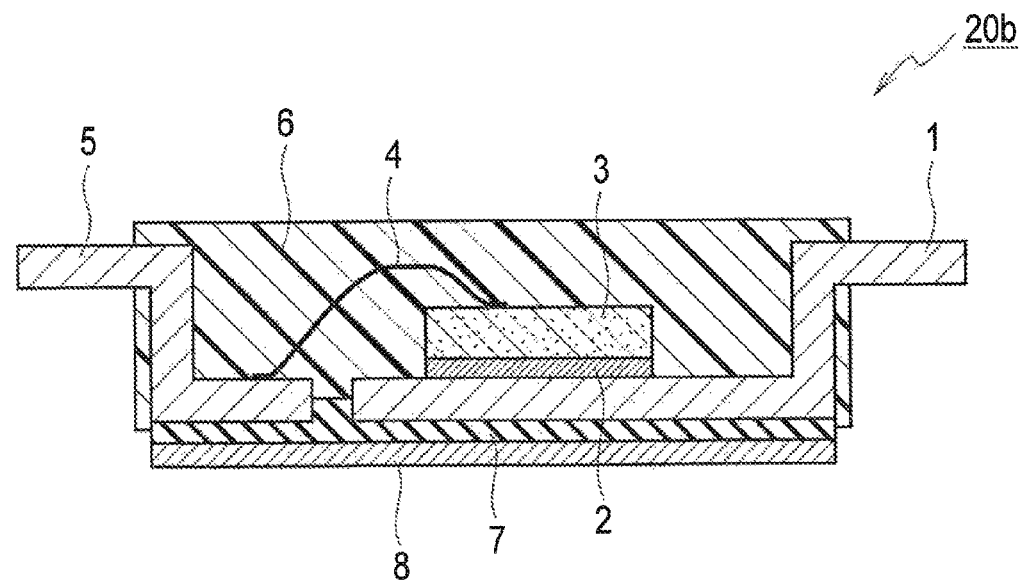
FIG. 2 is a schematic cross-sectional structure diagram of another power module according to the comparative example.

A schematic cross-sectional structure of another power module 20b according to the comparative example is illustrated as shown in FIG. 2. As shown in FIG. 2, there may be adopted a structure of bonding a metallic plate 8 on a bottom surface of the insulating layer 7. Thus, by disposing the metallic plate 8 on the outermost layer, the insulating layer 7 is covered with the metallic plate 8, and thereby it can prevent from an externally caused crack. The configuration of other portions is the same as that of the power module 20a.

Figure 3:
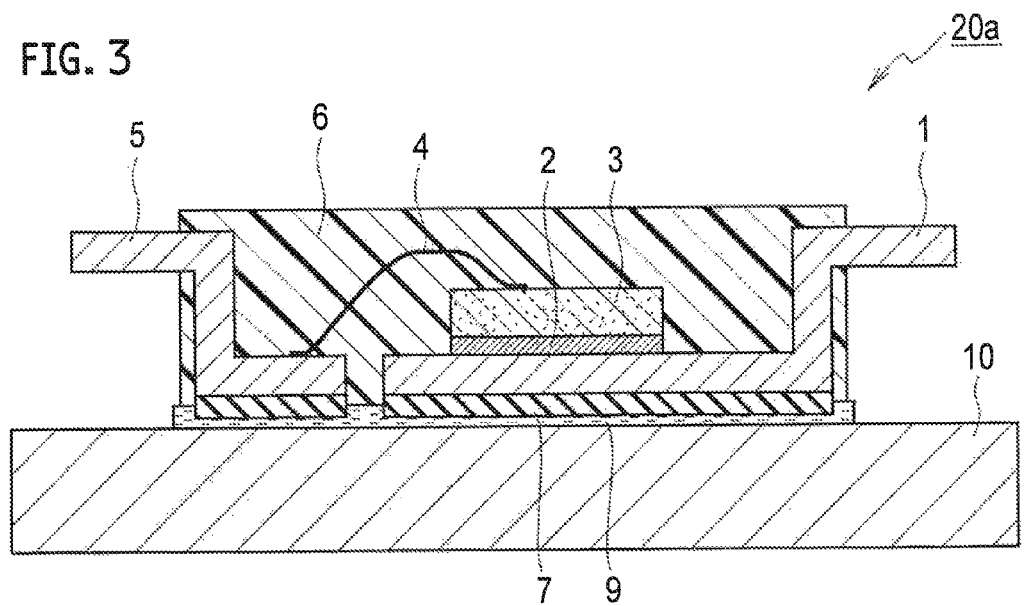
FIG. 3 is a schematic cross-sectional structure diagram showing a usage example of the power module shown in FIG. 1.
Figure 4:
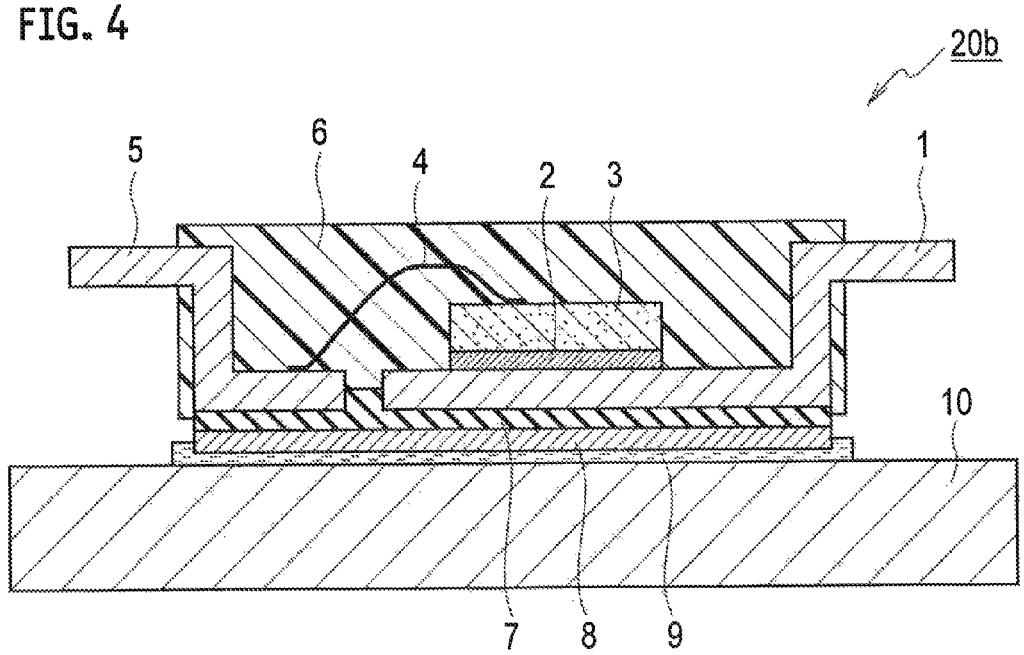
FIG. 4 is a schematic cross-sectional structure diagram showing a usage example of the power module shown in FIG. 2.

A schematic cross-sectional structure showing a usage example of the power module 20a shown in FIG. 1 is illustrated as shown in FIG. 3, and a schematic cross-sectional structure showing a usage example of the power module 20b shown in FIG. 2 is illustrated as shown in FIG. 4. As shown in FIGS. 3 and 4, the power modules 20a and 20b according to the comparative example are used by being screwed into a heat sink 10 via a liquid thermal compound 9.

In this case, in the power modules 20a and 20b according to the comparative example, the insulating layer 7 and the leadframes (metal layers) 1, 5 are contacted with each other on a flat surface. If external force is applied thereon in such a state where the insulating layer 7 and the metal layers 1, 5 are contacted with each other on a flat surface, the insulating layer 7 and the metal layers 1, 5 may be deviated (displaced) from each other, thereby causing insulation failure. Moreover, if the insulating layer 7 and the metal layers 1, 5 are deviated from each other and thereby a gap is formed therebetween, a thermal resistance of the power module (20a, 20b) may be increased. Thereby, since it becomes impossible to cool the semiconductor device as designed, there will be generated thermal run away of the semiconductor device, thermal deterioration of bonding layers, e.g. a solder 2, and fusing of the aluminum wire 4.

Since the thermal compound 9 is liquid, time and effort are required in work for coating. Moreover, the thermal compound 9 is also hardly treated since it is necessary to be coated uniformly and thinly. Furthermore, the whole of the power module (20a, 20b) becomes deformed by warping and restoring in a repetition of cooling and heating due to operating environments, and thereby the liquid thermal compound 9 may be gradually pushed out (pumped out) therefrom. If the thermal compound 9 is pumped out therefrom, a gap may be generated between a bottom surface of the power module (20a, 20b) and the heat sink 10, and thereby a thermal resistance of the portion where the gap is generated will be increased. As a result, since the semiconductor device cannot fully be cooled, it becomes a cause of the thermal run away of the semiconductor device, the thermal deterioration of bonding layers, e.g. a solder 2, and the fusing of the aluminum wire 4 as previously explained.

(Embodiment)

Figure 5:
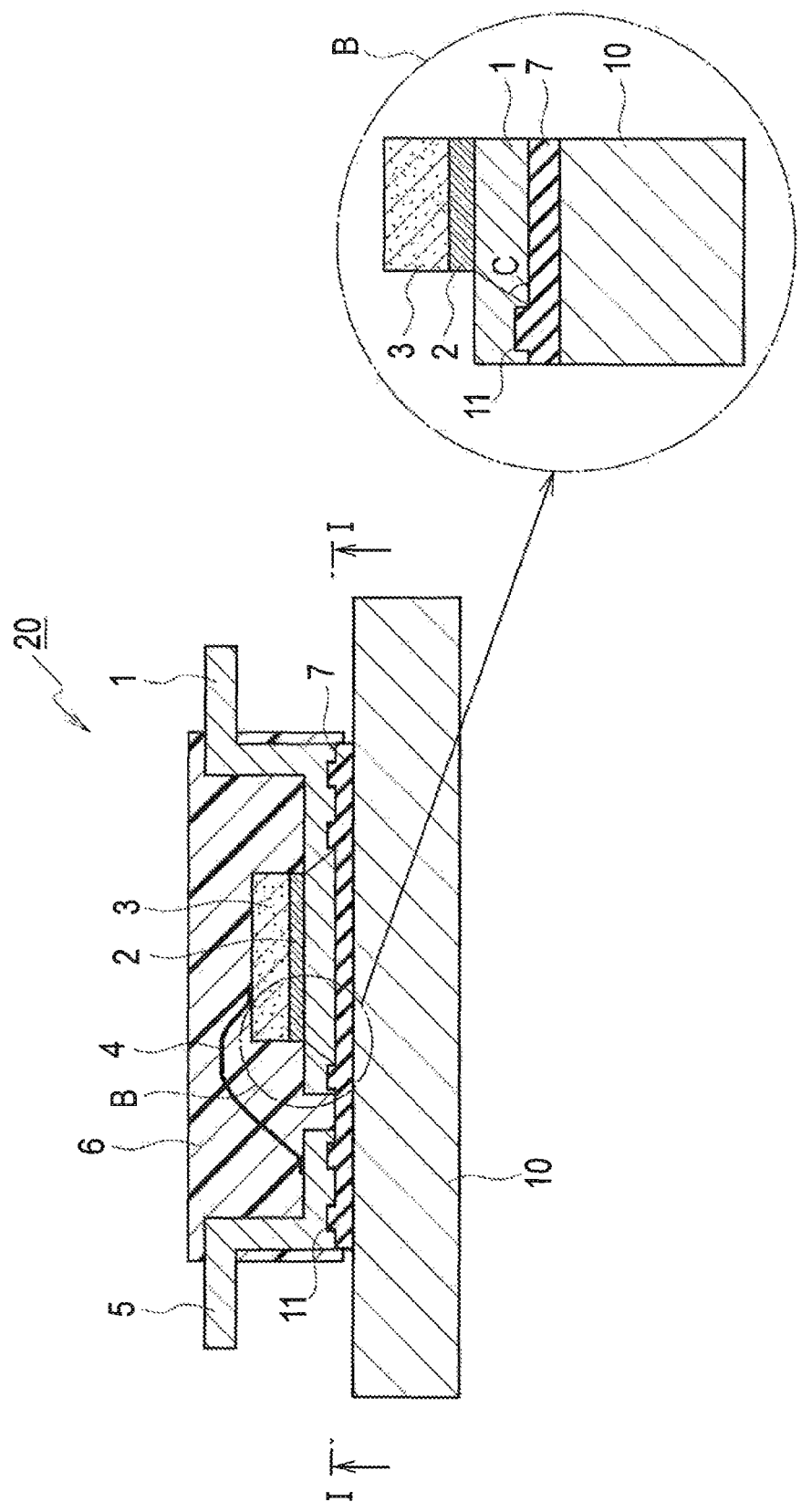
FIG. 5 is a schematic cross-sectional structure diagram of a power module according the embodiment.

As shown in FIG. 5, a power module 20 according to the embodiment includes: an insulating layer 7; leadframes (metal layers) 1, 5 respectively disposed on the insulating layer 7; and a semiconductor chip 3 disposed on the leadframe 1, wherein a groove 11 into which a part of the insulating layer 7 is inserted is formed on a surface of the leadframes 1, 5 facing (opposed to) the insulating layer 7.

In the embodiment, the groove 11 may also be formed outside a region to which a heat generated from the semiconductor chip 3 is conducted.

Moreover, an angle between the semiconductor chip 3 and the groove 11 may be equal to or less than 45 degrees.

Moreover, the groove 11 may be formed only outside the region to which the heat generated from the semiconductor chip 3 is conducted.

Moreover, a cross-sectional shape of the groove 11 may be at least one shape selected from the group consist of a rectangle shape, a semicircle shape, a semi-ellipse shape, triangular shape, and a wedge shape.

Moreover, the groove 11 may be formed along in one direction or may be formed in a lattice-like shape.

Moreover, a surface roughening process may be applied on a surface of the leadframes 1, 5 facing the insulating layer 7.

Moreover, the insulating layer 7 may be formed of a material(s) softer than the leadframes 1, 5.

Moreover, a hardness of the insulating layer 7 may be softer than A40 in durometer hardness.

Moreover, the insulating layer 7 may be formed of an organic material(s).

Moreover, the insulating layer 7 may be formed of a silicone based resin(s).

Moreover, the insulating layer 7 may be filled up with a high thermally-conductive filler.

Moreover, the filler may be at least one selected from the group consist of aluminium oxide, silicon oxide, aluminum nitride, silicon nitride, boron nitride, beryllia, and magnesia.

Moreover, the insulating layer 7 may be formed before the semiconductor chip 3 is molded with a mold resin 6.

Moreover, an edge part of the insulating layer 7 may be intervened between the mold resin 6 and the leadframes 1, 5.

Moreover, the insulating layer 7 may be formed after the semiconductor chip 3 is molded with the mold resin 6.

Moreover, the mold resin 6 and the leadframes 1, 5 may be formed so as to be flush with each other.

(Power Module)

Hereinafter, there will now be explained a configuration of the power module 20 according to the embodiment in more detail, with reference to FIG. 5. As already explained, the groove 11 into which apart of the insulating layer 7 is inserted is formed in the surface of the leadframes 1, 5 facing (opposed to) the insulating layer 7, in the power module 20 according to the embodiment.

A flexible resin (organic material) is used for the insulating layer 7. The flexible resin is preferably a material(s) softer than the leadframes 1, 5, and is also preferably a resin softer than A40 in durometer hardness (e.g., silicone resin, etc.). Moreover, the resin used for the insulating layer 7 is filled up with a high thermally-conductive filler of approximately 1 to 20 W/mK degrees, for example. As such a filler, aluminium oxide, silicon oxide, aluminum nitride, silicon nitride, boron nitride, beryllia, magnesia, etc. can be used.

Thus, since the insulating layer 7 is tightly insert in the groove 11 by using the flexible resin for the insulating layer 7, the insulating layer 7 can be strongly bonded to the leadframes 1 and 5 without increasing the thermal resistance (anchor effect). Moreover, since the insulating layer 7 is sufficiently compatible with the surface of the heat sink 10 due to the flexibility thereof, it becomes unnecessary to coat the liquid thermal compound 9 between the bottom surface of the power module 20 and the heat sink 10 as in the case of the comparative example.

As shown in the principal part B in FIG. 5, the groove 11 is formed outside a region extended in downward direction by only the angle C from a bottom head of the solder 2. Since a heat generated from the semiconductor chip 3 is conducted by being spread at approximately 45 degrees, it is preferable to set the angle C to be equal to or less than 45 degrees. Accordingly, since no groove 11 is formed in a region to which the heat is conducted, a defect due to increase of the thermal resistance can be avoided, thereby improving the reliability thereof.

(Usage Example)

Figure 6:
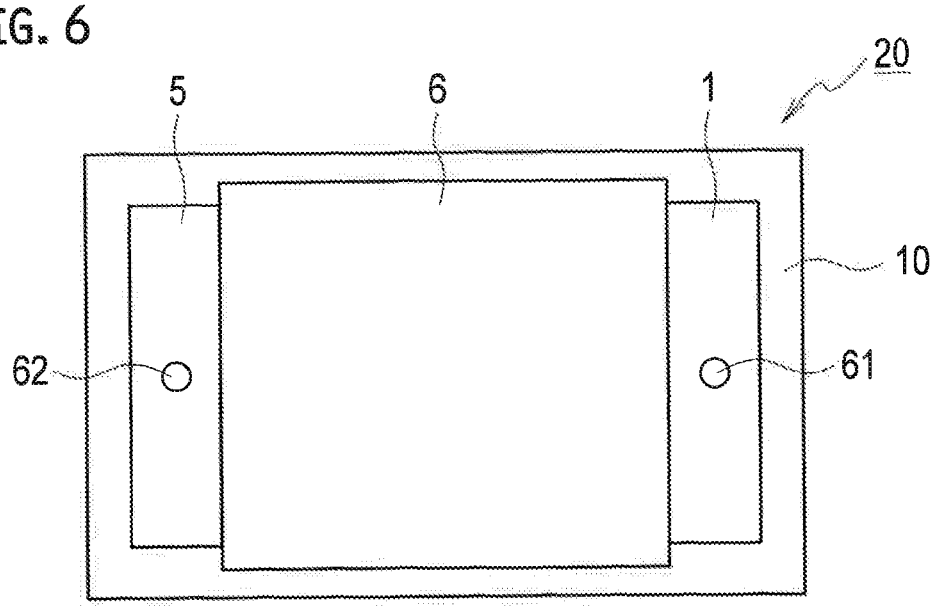
FIG. 6 is a schematic planar structure FIG. showing a usage example of the power module according to the embodiment.

A schematic planar structure showing a usage example of the power module 20 according to the embodiment is illustrated as shown in FIG. 6. As shown in FIG. 6, the leadframes 1, 5 are respectively screwed into the heat sink 10 with screws 61, 62. Needless to say, a position to be screwed or the number of the screws can be appropriately modified. According to such a configuration, even if a flexible resin is used for the insulating layer 7, the power module 20 is strongly joined to the heat sink 10.

(Formed Direction of Groove)

Figure 7:
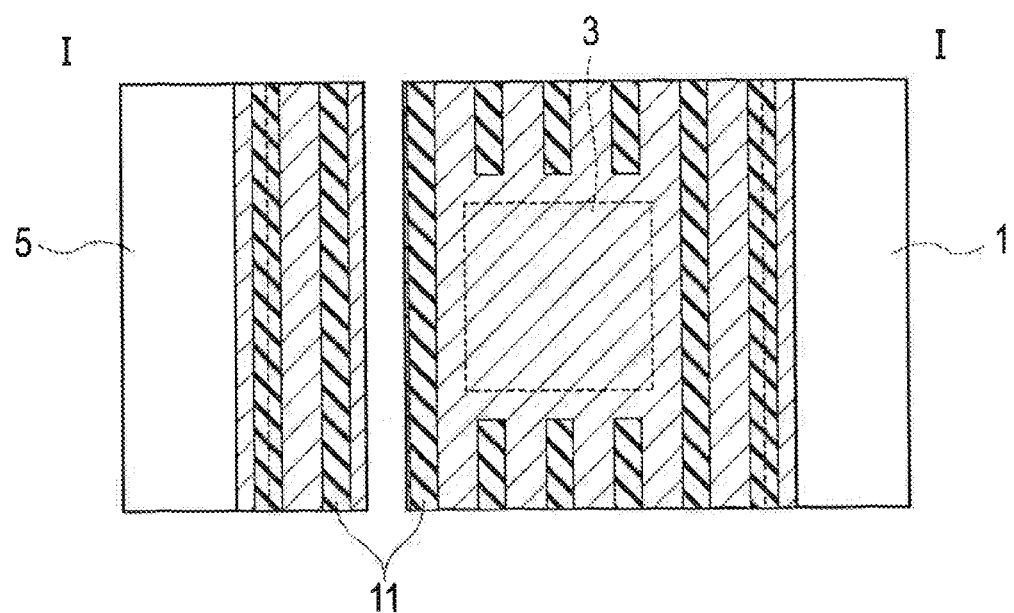
FIG. 7 is a schematic cross-sectional structure diagram taken in the line I-I of FIG. 5.

A schematic cross-sectional structure taken in the line I-I shown in FIG. 5 is illustrated as shown in FIG. 7. As shown in FIG. 7, a plurality of the grooves 11 may be formed in a vertical direction. The vertical direction used herein is a short-side direction of the power module 20. In this case, a bonding strength between the insulating layer 7 and the metal layers 1, 5 can be improved against external force applied in particular on a long-side direction of the power module 20.

Figure 8:
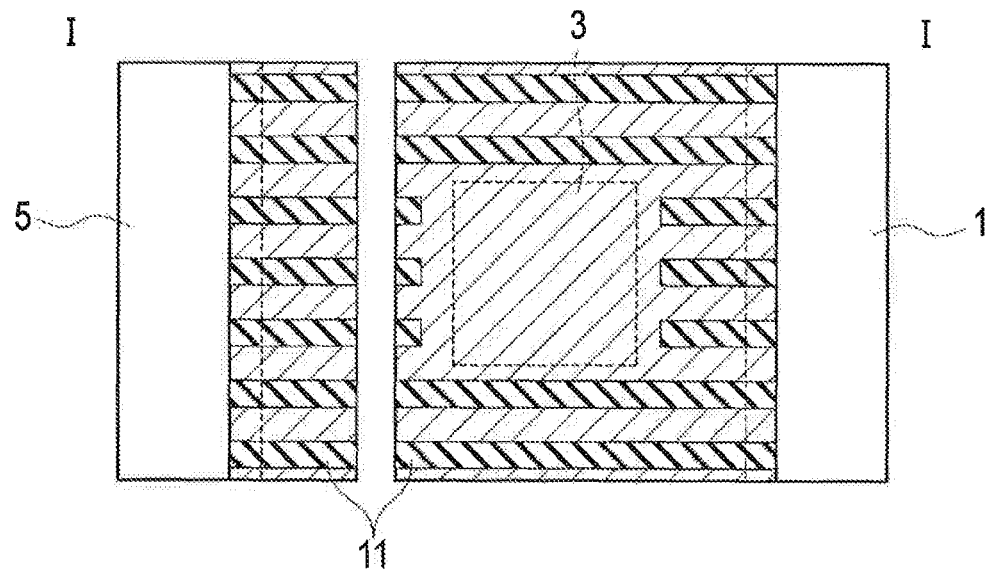
FIG. 8 is another schematic cross-sectional structure diagram taken in the line I-I of FIG. 5.

Another schematic cross-sectional structure taken in the line I-I shown in FIG. 5 is illustrated as shown in FIG. 8. As shown in FIG. 8, a plurality of the grooves 11 may be formed in a horizontal direction. The horizontal direction used herein is a long-side direction of the power module 20. In this case, a bonding strength between the insulating layer 7 and the metal layers 1, 5 can be improved against external force applied in particular on the short-side direction of the power module 20.

Figure 9:
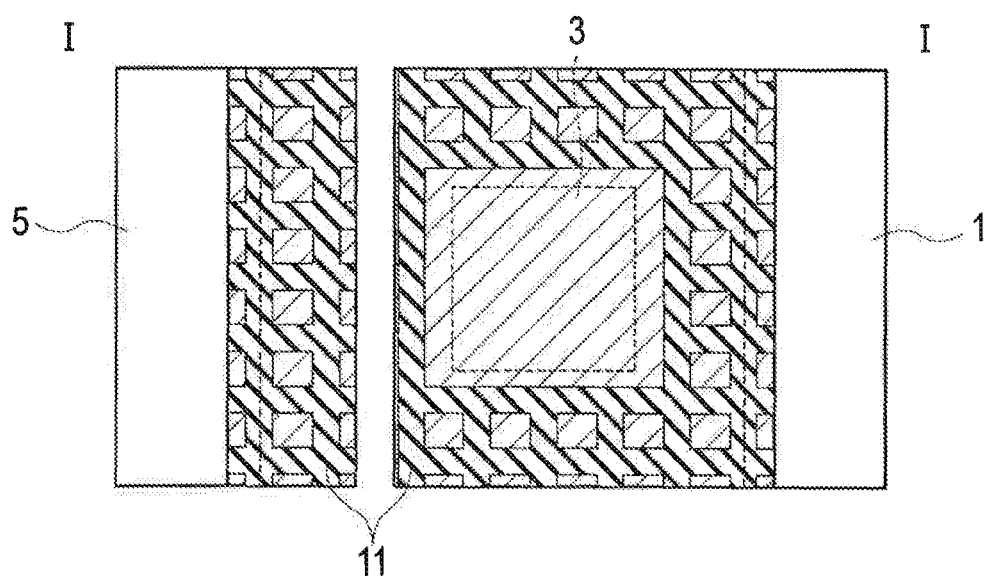
FIG. 9 is still another schematic cross-sectional structure diagram taken in the line I-I of FIG. 5.

Still another schematic cross-sectional structure taken in the line I-I shown in FIG. 5 is illustrated as shown in FIG. 9. The groove 11 may be formed in a lattice-like shape as shown in FIG. 9. Thereby, the bonding strength between the insulating layer 7 and the metal layers 1, 5 can further be improved as compared with the groove 11 formed in one direction, e.g. the vertical direction or horizontal direction.

Although the case where the groove 11 is formed in a vertical or direction, or in a lattice-like shape has been exemplified herein, the formed direction of the groove 11 is not limited to the above-mentioned examples. For example, the groove 11 may be obliquely formed in one direction with respect to the semiconductor chip 3, or may be obliquely formed in a lattice-like shape.

(Cross-Sectional Shape of Groove)

Figure 10:
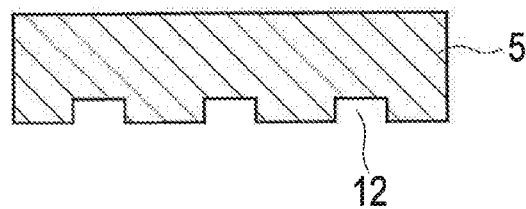
FIG. 10 is an enlarged schematic cross-sectional structure diagram of a part of leadframe in the power module according to the embodiment.

An enlarged schematic cross-sectional structure showing a part of the leadframe 5 in the power module 20 according to the embodiment is illustrated as shown in FIG. 10. As shown in FIG. 10, the groove 12 may be formed in a rectangle shape in a cross sectional view. If the thickness of the leadframe 5 is approximately 3 mm, for example, the depth of the groove 12 is preferably approximately 0.5 to 1.5 mm, for example. Moreover, the distance between the adjacent grooves 12, and the width of each groove 12 are preferable to be approximately equal to each other.

Figure 11:
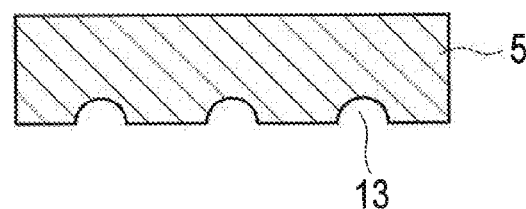
FIG. 11 is another enlarged schematic cross-sectional structure diagram of the part of the leadframe in the power module according to the embodiment.

Another enlarged schematic cross-sectional structure showing a part of the leadframe 5 in the power module 20 according to the embodiment is illustrated as shown in FIG. 11. As shown in FIG. 11, the groove 13 may be formed in a semicircle shape or semi-ellipse shape in a cross sectional view. The depth and the distance of such a groove 13 are also the same as those of the case of the rectangular groove 12.

Figure 12:
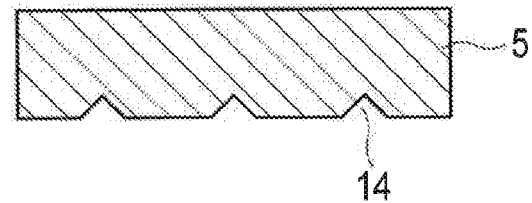
FIG. 12 is still another enlarged schematic cross-sectional structure diagram of the part of the leadframe in the power module according to the embodiment.

Yet another enlarged schematic cross-sectional structure showing a part of the leadframe 5 in the power module 20 according to the embodiment is illustrated as shown in FIG. 12. As shown in FIG. 12, the groove 14 may be formed in a triangular shape in a cross sectional view. The depth and the distance of such a groove 14 are also the same as those of the case of the rectangular groove 12.

Figure 13:
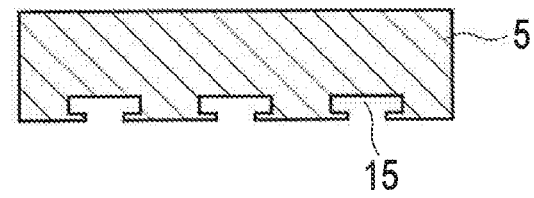
FIG. 13 is yet another enlarged schematic cross-sectional structure diagram of the part of the leadframe in the power module according to the embodiment.

Yet another enlarged schematic cross-sectional structure showing a part of the leadframe 5 in the power module 20 according to the embodiment is illustrated as shown in FIG. 13. As shown in FIG. 13, the groove 15 may be formed in a wedge shape in a cross sectional view. The depth and the distance of such a groove 15 are also the same as those of the case of the rectangular groove 12.

Figure 14:
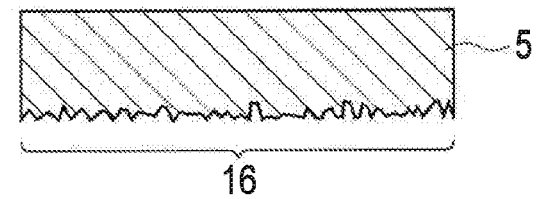
FIG. 14 is yet another enlarged schematic cross-sectional structure diagram of the part of the leadframe in the power module according to the embodiment.

Yet another enlarged schematic cross-sectional structure showing a part of the leadframe 5 in the power module 20 according to the embodiment is illustrated as shown in FIG. 14. As shown in FIG. 14, the groove 16 may be formed by applying a surface roughening process to the bottom surface of the leadframes 1 and 5 by using a sandblast or etching. In this case, although the shape of the groove is an indeterminate form, the insulating layer 7 and the metal layers 1, 5 are not easily deviated from each other, and thereby it can produce a similar effect in that the reliability is improved.

In the embodiment, although there have been exemplified the case where the respective grooves 12-15 are formed in a rectangle shape, a semicircle shape, a semi-ellipse shape, a triangular shape, and a wedge shape, and the case where the groove 16 is formed by applying the surface roughening process, these cases may be combined with one another. Although not specifically mentioned in the embodiment, the grooves 12-16 are, of course, formed outside a region extended in downward direction by only the angle C from the bottom head of the solder 2, as shown in the principal part B in FIG. 5.

(Fabrication Method 1)

A process showing a fabrication method of the power module 20 according to the embodiment is illustrated as shown in FIG. 15. Although only a portion at the side of the leadframe 1 is shown in FIG. 15, other portions are as being shown in FIG. 5.

Figure 15A:
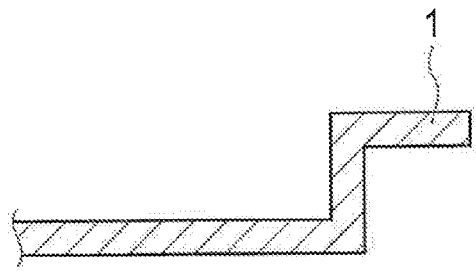
FIG. 15A is a cross-sectional diagram showing a state before forming a groove, in a process chart showing a fabrication method of the power module according to the embodiment.
Figure 15B:
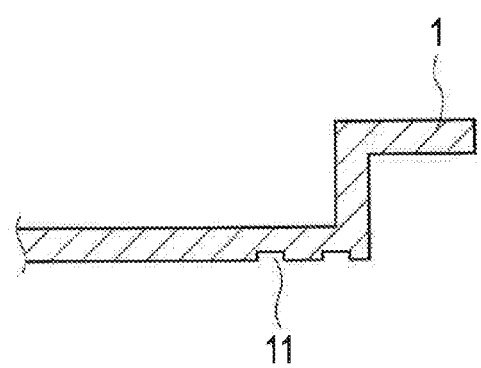
FIG. 15B is a cross-sectional diagram showing a state after forming the groove, in the process chart showing the fabrication method of the power module according to the embodiment.

Firstly, the groove 11 is formed in the bottom surface of the leadframes 1, 5 formed of Cu, AL, or an alloy thereof, as shown in FIGS. 15A and 15B. The fabrication method of the groove 11 is not particularly limited thereto. For example, when punching the leadframes 1, 5, the groove 11 may be simultaneously formed.

Figure 15C:
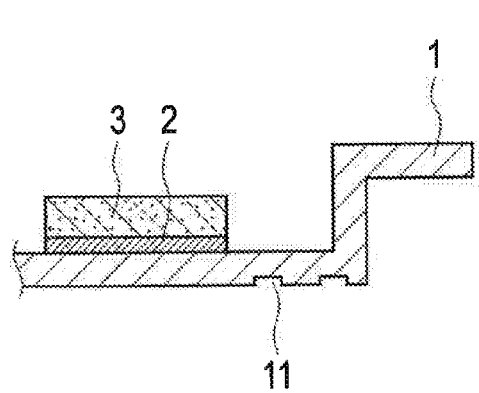
FIG. 15C is a cross-sectional diagram showing a state where a semiconductor chip is bonded thereon, in the process chart showing the fabrication method of the power module according to the embodiment.

Next, as shown in FIG. 15C, the semiconductor chip 3 is bonded to the leadframe 1 with the solder 2. A high thermally-conductive silver paste may be used as the solder layer 2.

Figure 15D:
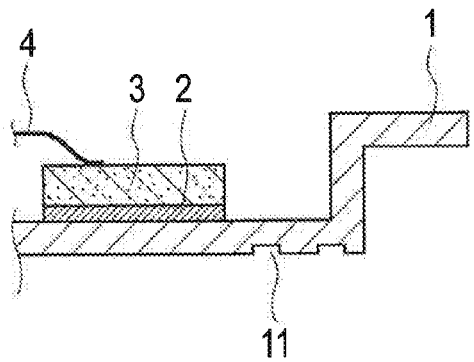
FIG. 15D is a cross-sectional diagram showing a state where an aluminum wire is connected thereto, in the process chart showing the fabrication method of the power module according to the embodiment.

Next, as shown in FIG. 15D, in order to electrically connect the semiconductor chip 3 and the leadframe 5 to each other, ultrasonic bonding is applied thereto using the aluminum wire 4. In this case, the leadframe 1 and the leadframe 5 are connected to each other with a connector bar (not shown) in order to prevent from relative positions thereof being displaced from each other at the time of the ultrasonic bonding. The connector bar will be removed after the ultrasonic bonding is completed.

Figure 15E:
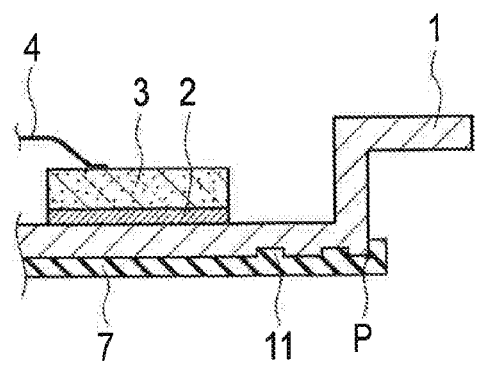
FIG. 15E is a cross-sectional diagram showing a state where an insulating layer is formed thereon, in the process chart showing the fabrication method of the power module according to the embodiment.

Next, as shown in FIG. 15E, the leadframe 1 and the leadframe 5 are disposed on a metallic mold (not shown), and then the insulating layer 7 is formed on the bottom surfaces of the leadframes 1 and 5. The thickness of the insulating layer 7 is approximately 0.5 mm. Screen printing etc. may be suitable as a fabrication method of the insulating layer 7. At this time, the insulating layer 7 is formed so as to cover a corner portion P of the leadframes 1, 5. Although FIG. 15 shows only the case where the corner portion P is a right-angled corner portion, the corner portion P may also be an obtuse-angled corner portion.

Figure 15F:
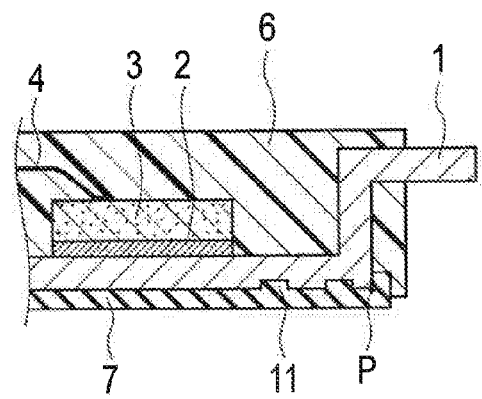
FIG. 15F is a cross-sectional diagram showing a state where the power module is molded, in the process chart showing the fabrication method of the power module according to the embodiment.

Finally, after curing the insulating layer 7, the metallic mold is closed, and then the mold resin 6 is poured therein in order to mold the leadframe 1, the solder 2, the semiconductor chip 3, the aluminum wire 4, and the leadframe 5, as shown in FIG. 15F. Thereby, the power module 20 molded with the mold resin 6 can be fabricated.

According to such a fabrication method, an edge part of the insulating layer 7 is intervened between the mold resin 6 and the leadframes 1, 5. Accordingly, a possibility of short-circuiting at the corner portion P of the leadframes 1, 5 can be reduced.

(Fabrication Method 2)

A process showing another fabrication method of the power module 20 according to the embodiment is illustrated as shown in FIG. 16. A different point from the fabrication method 1 (FIG. 15) is a point that the order of the process of molding and the process of forming the insulating layer 7 are reversed.

Figure 16A:
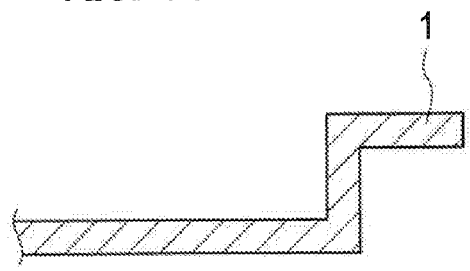
FIG. 16A is a cross-sectional diagram showing a state before forming a groove, in a process chart showing another fabrication method of the power module according to the embodiment.
Figure 16D:
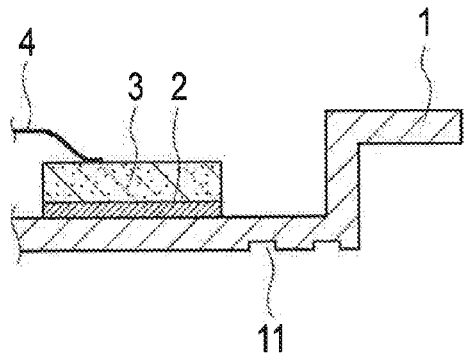
FIG. 16D is a cross-sectional diagram showing a state where an aluminum wire is connected thereto, in the process chart showing another fabrication method of the power module according to the embodiment.
Figure 16B:
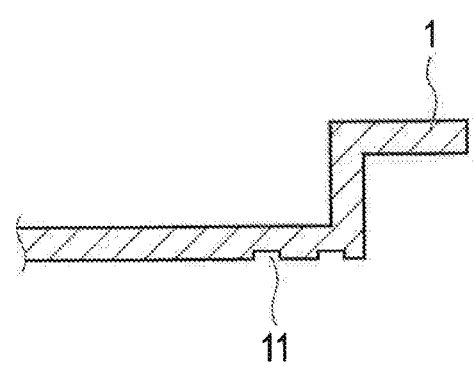
FIG. 16B is a cross-sectional diagram showing a state after forming the groove, in the process chart showing another fabrication method of the power module according to the embodiment.
Figure 16E:
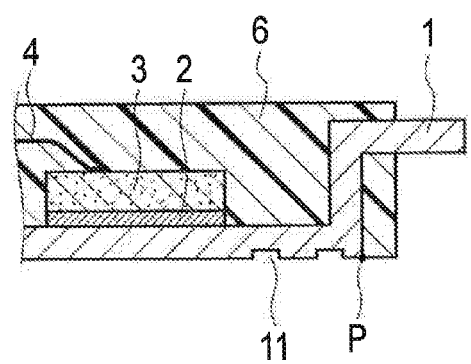
FIG. 16E is a cross-sectional diagram showing a state where the power module is molded, in the process chart showing another fabrication method of the power module according to the embodiment.
Figure 16C:
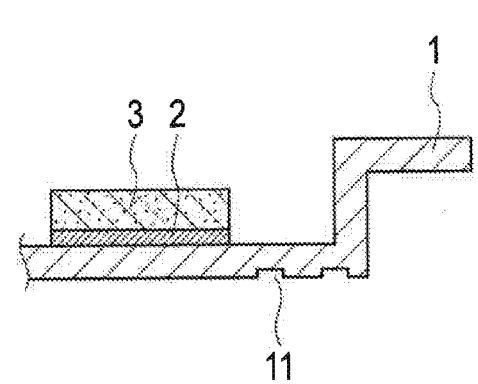
FIG. 16C is a cross-sectional diagram showing a state where a semiconductor chip is bonded thereon, in the process chart showing another fabrication method of the power module according to the embodiment.
Figure 16F:
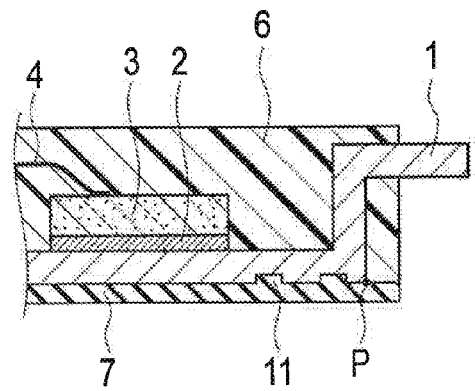
FIG. 16F is a cross-sectional diagram showing a state where an insulating layer is formed thereon, in the process chart showing another fabrication method of the power module according to the embodiment.

The respective processes of FIGS. 16A to 16D are the same as the respective processes of FIGS. 15A to 15D. More specifically, the groove 11 is formed in the bottom surfaces of the leadframes 1, 5, then the semiconductor chip 3 is bonded to the leadframe 1, and then the semiconductor chip 3 and the leadframe 5 are connected to each other with the aluminum wire 4. In this step, as shown in FIG. 16E, the metallic mold is closed and then the mold resin 6 is poured therein. The mold resin 6 and the leadframe 1 are formed so as to be flush with each other at the corner portion P, at this time. Finally, as shown in FIG. 16F, the insulating layer 7 is formed on the surface of the mold resin 6 and the surface of the leadframes 1, 5 which are flush with each other. According to such a fabrication method, the corner portion P of the leadframes 1, 5 is covered with the insulating layer 7, and thereby a possibility of short-circuiting at the corner portion P can also be reduced.

As mentioned above, the power module 20 according to the embodiment is a resin-sealed semiconductor module having a vertical structure of the semiconductor chip/the metal layer/the insulating layer. In such a structure, the groove 11 into which a part of the insulating layer 7 is inserted is formed in the surface of the metal layers 1, 5 facing the insulating layer 7. Thereby, even if external force is applied thereon, since the bonding strength between the insulating layer 7 and the metal layers 1, 5 is improved, the insulating layer 7 and the metal layers 1, 5 are hardly deviated from each other, thereby preventing inferior insulation. Moreover, since the insulating layer 7 and the metal layers 1, 5 are hardly deviated from each other and thereby a gap is hardly formed therebetween, a thermal resistance of the power module (20a, 20b) is hardly increased. Accordingly, since it becomes possible to cool the semiconductor device as designed, there are hardly generated thermal run away of the semiconductor device, thermal deterioration of bonding layers, e.g. a solder 2, and fusing of the aluminum wire 4, thereby improving the reliability thereof. Moreover, since the groove 11 is arranged in consideration of spreading of heat so that conduction of the heat generated from the semiconductor chip 3 may be hardly obstructed by the groove 11, the cooling capability is not inhibited. In addition, since the flexible resin is used for the insulating layer 7, the liquid thermal compound 9 becomes unnecessary, and therefore it becomes possible to provide the power module 20 easy to handle.

(Examples of Module)

Hereinafter, there will now be explained examples of the power module 20 according to the embodiment. Needless to say, the groove 11 can be formed also in the leadframes 1, 5 of the power module 20 explained below. A formed direction, a cross-sectional shape, and other details configuration of the groove 11 are the same as described above.

FIG. 11 illustrates a schematic circuit representative of a one-in-one (1-in-1) module, which is the power module 20 according to the embodiment. Moreover, FIG. 18 illustrates a detail circuit representative of the 1-in-1 module, which is the power module 20 according to the embodiment.

The power module 20 according to the embodiment has a configuration of 1-in-1 module. More specifically, one MOSFETQ is included in one module. As an example, five chips (MOS transistor×5) can be mounted thereon, and a maximum of five pieces of the MOSFETs respectively can be connected to one another in parallel. Note that it is also possible to mount a part of five pieces of the chips for the diode DI thereon.

Figure 17:
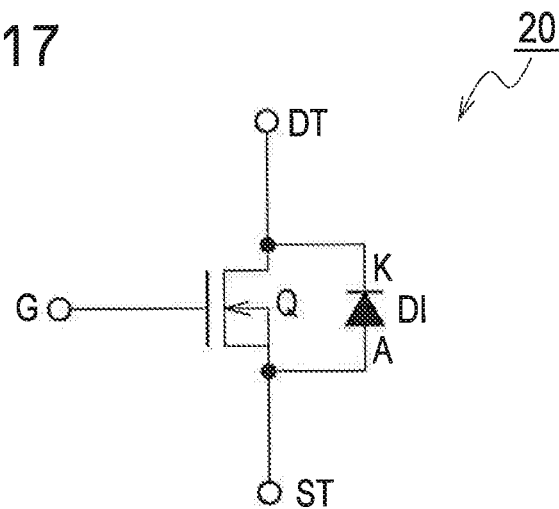
FIG. 17 is a schematic circuit representative diagram showing a 1-in-1 module, which is the power module according to the embodiment.

The diode DI connected to the MOSFETQ inversely in parallel is shown in FIG. 17. A main electrode of the MOSFETQ is expressed with a drain terminal DT and a source terminal ST.

Figure 18:
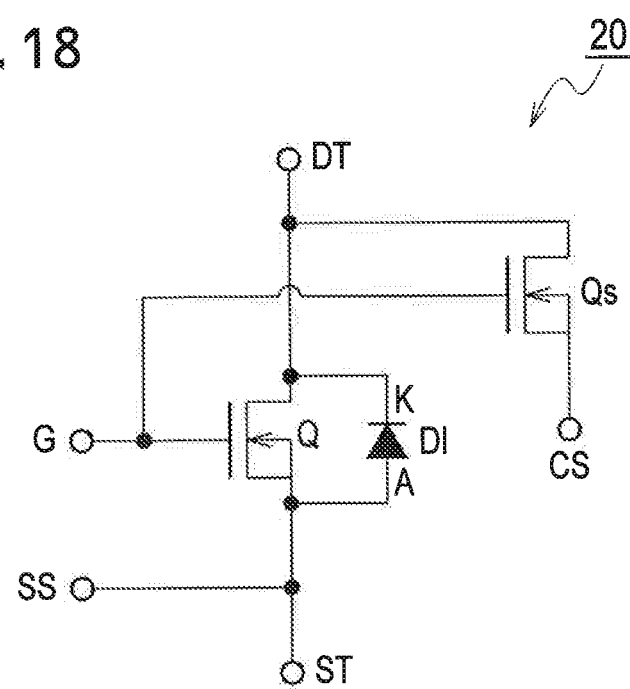
FIG. 18 is a detail circuit representative diagram showing the 1-in-1 module, which is the power module according to the embodiment.

More particularly, as shown in FIG. 18, a sense MOSFET Qs is connected to the MOSFETQ in parallel. The sense MOSFET Qs is formed as a minuteness transistor in the same chip as the MOSFET Q. In FIG. 18, reference numeral SS denotes a source sense terminal, reference numeral CS denotes a current sense terminal, and reference numeral G denotes a gate signal terminal. Note that, also in the semiconductor device Q according to the embodiment, the sense MOSFET Qs is formed as a minuteness transistor in the same chip.

Figure 19:
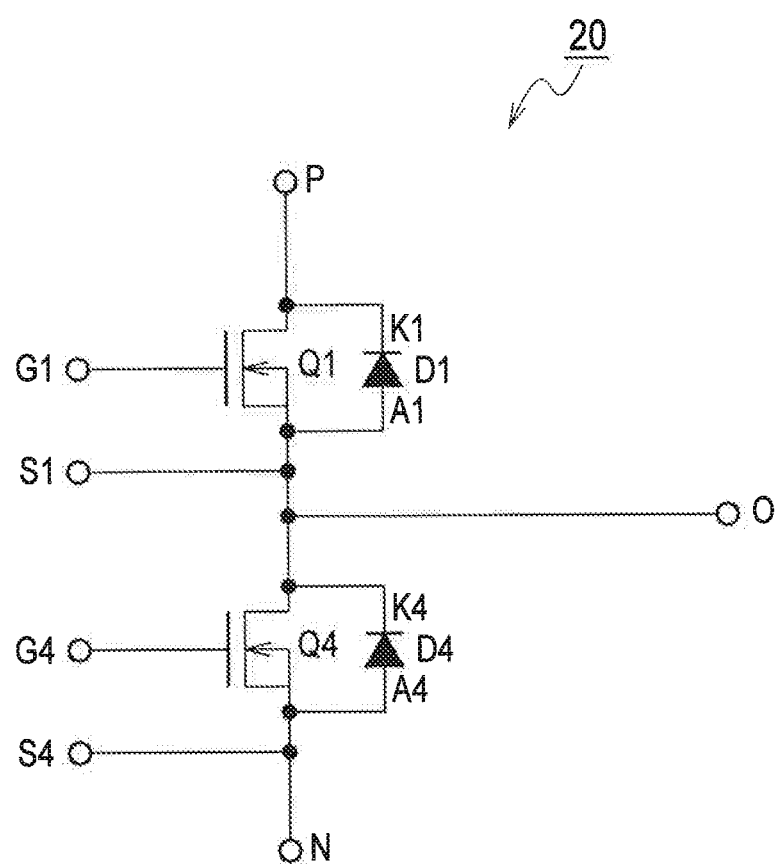
FIG. 19 is a schematic circuit representative diagram showing a 2-in-1 module, which is the power module according to the embodiment.

Moreover, FIG. 19 illustrates a schematic circuit representative of a 2-in-1 module, which is the power module 20 according to the embodiment. As shown in FIG. 19, two MOSFETs Q1, Q4 are included in one module. Reference numeral G1 denotes a gate signal terminal of the MOSFET Q1, and reference numeral S1 denotes a source sense terminal of the MOSFET Q1. Reference numeral G4 denotes a gate signal terminal of the MOSFET Q4, and reference numeral S4 denotes a source sense terminal of the MOSFET Q4. Reference numeral P denotes a positive side power input terminal, reference numeral N denotes a negative side power input terminal, and reference numeral O denotes an output terminal.

(Configuration Example of Semiconductor Device)

Figure 20:
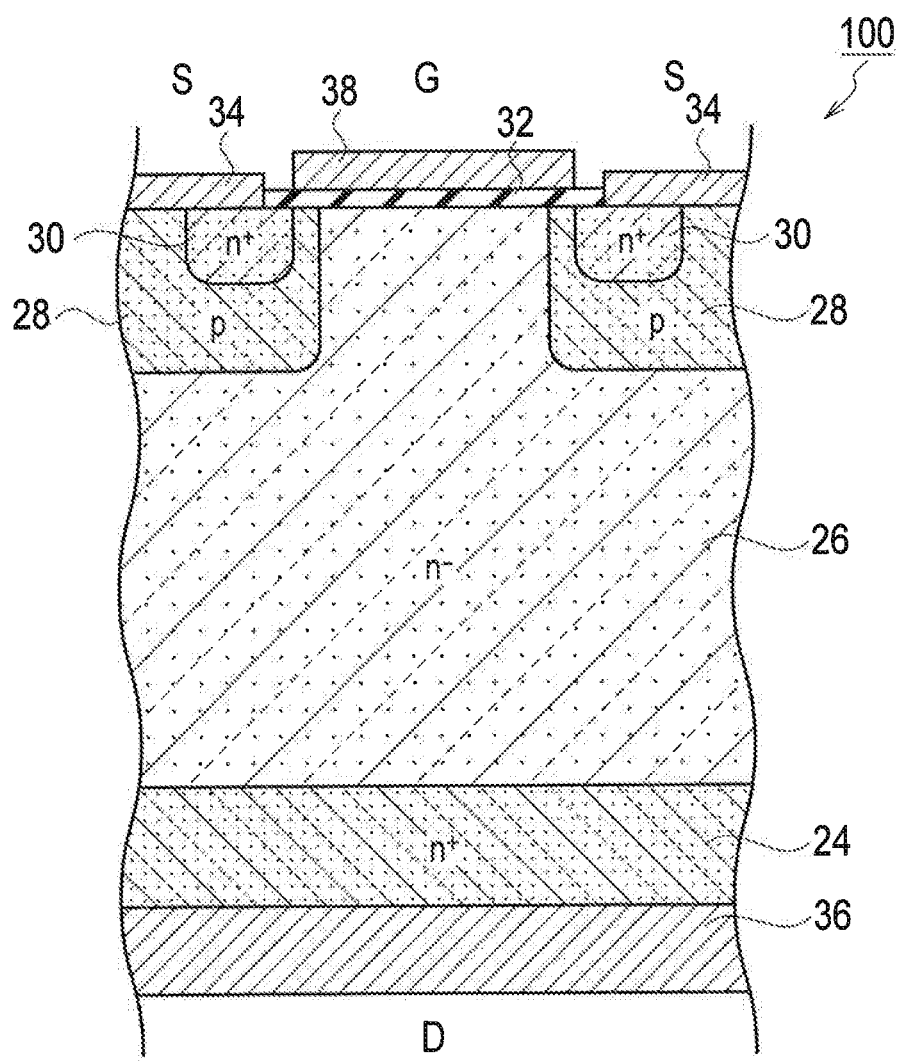
FIG. 20 is a schematic cross-sectional structure diagram showing an SiC MOSFET, which is an example of a semiconductor device applied to the power module according to the embodiment.

As shown in FIG. 20, a schematic cross-sectional structure of the SiC MOSFET as an example of the semiconductor device 100 (Q) applied to the power module 20 according to the embodiment includes: a semiconductor substrate 26 composed of an $n^-$ type high resistivity layer; a p type base region 28 formed on the surface side of the semiconductor substrate 26; source regions 30 formed on the surface of the p type base regions 28; a gate insulating film 32 disposed on the surface of the semiconductor substrate 26 between the p type base regions 28; a gate electrode 38 disposed on the gate insulating film 32; a source electrode 34 connected to the source region 30 and the p type base region 28; an $n^+$ drain region 24 disposed on a back side surface opposite to the surface of the semiconductor substrate 26; and a drain pad electrode 36 connected to the $n^+$ drain region 24.

In FIG. 20, although the semiconductor device 100 is composed of a planar-gate-type n channel vertical SiC-MOSFET, the semiconductor device 100 may be composed of a trench-gate-type n channel vertical SiC-MOSFET, etc.

Moreover, a GaN based FET etc. instead of SiC MOSFET are also applicable to the semiconductor device 100 (Q) applied to the power module 20 according to the embodiment.

Any one of an SiC based power device, a GaN based power device, and an AlN based power device is applicable to the semiconductor device 100 applied to the power module 20 according to the embodiment.

Furthermore, a semiconductor of which the bandgap energy is from 1.1 eV to 8 eV, for example, can be used for the semiconductor device 100 applied to the power module 20 according to the embodiment.

Figure 21:
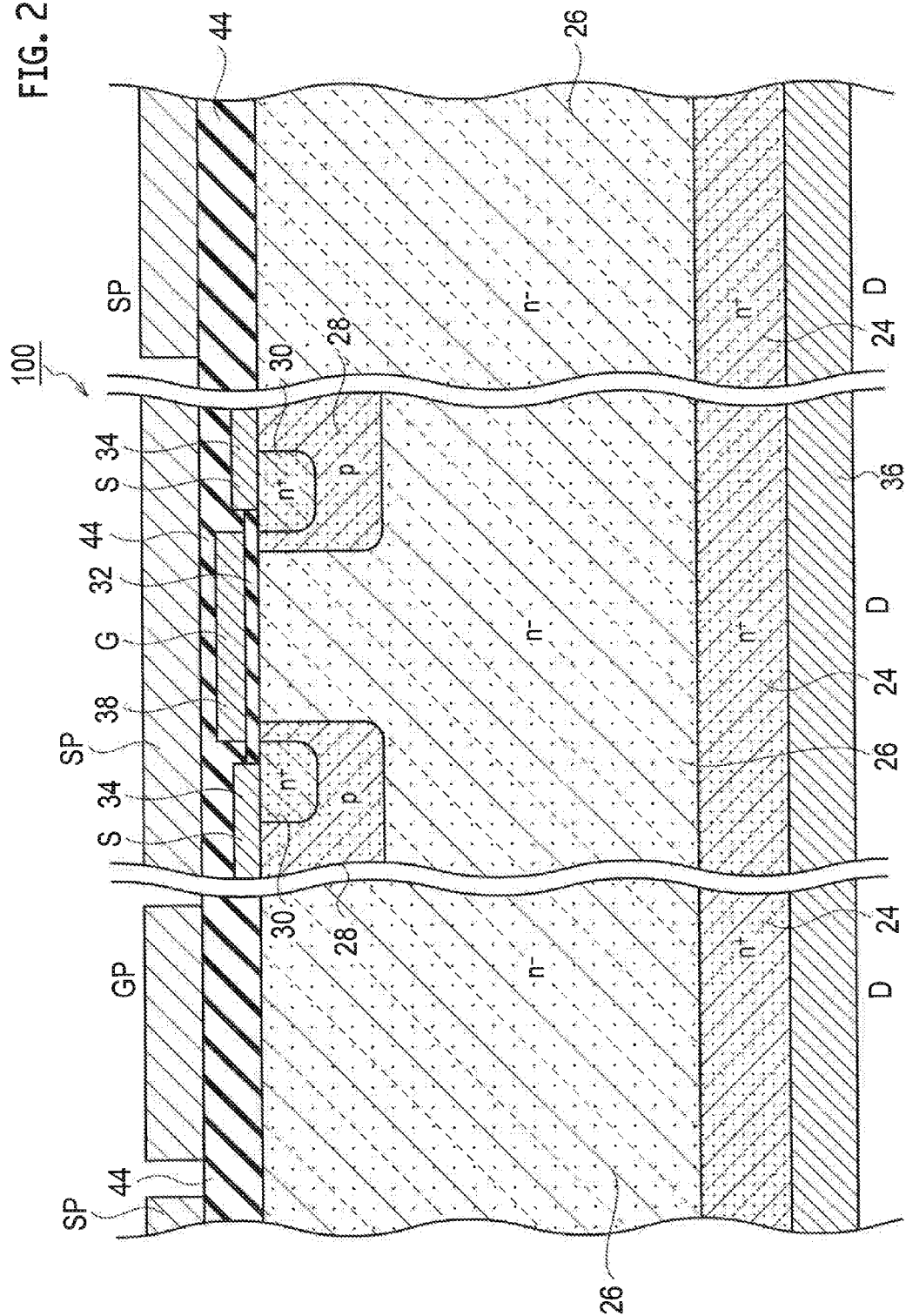
FIG. 21 is a schematic cross-sectional structure diagram showing an SiC MOSFET including a source pad electrode SP and a gate pad electrode GP, which is an example of the semiconductor device applied to the power module according to the embodiment.

FIG. 21 illustrates a schematic cross-sectional structure of an SiC MOSFET including a source pad electrode SP and a gate pad electrode GP, which is an example of the semiconductor device 100 applied to the power module 20 according to the embodiment. The gate pad electrode GP is connected to the gate electrode 38 disposed on the gate insulating film 32, and the source pad electrode SP is connected to the source electrode 34 connected to the source region 30 and the p type base region 28.

Moreover, as shown in FIG. 21, the gate pad electrode GP and the source pad electrode SP are disposed on an interlayer insulating film 44 for passivation which covers the surface of the semiconductor device 100. Microstructural transistor structure may be formed in the semiconductor substrate 26 below the gate pad electrode GP and the source pad electrode in the same manner as the center portion shown in FIG. 20 or 21.

Furthermore, as shown in FIG. 21, the source pad electrode SP may be disposed to be extended onto the interlayer insulating film 44 for passivation, also in the transistor structure of the center portion.

Figure 22:
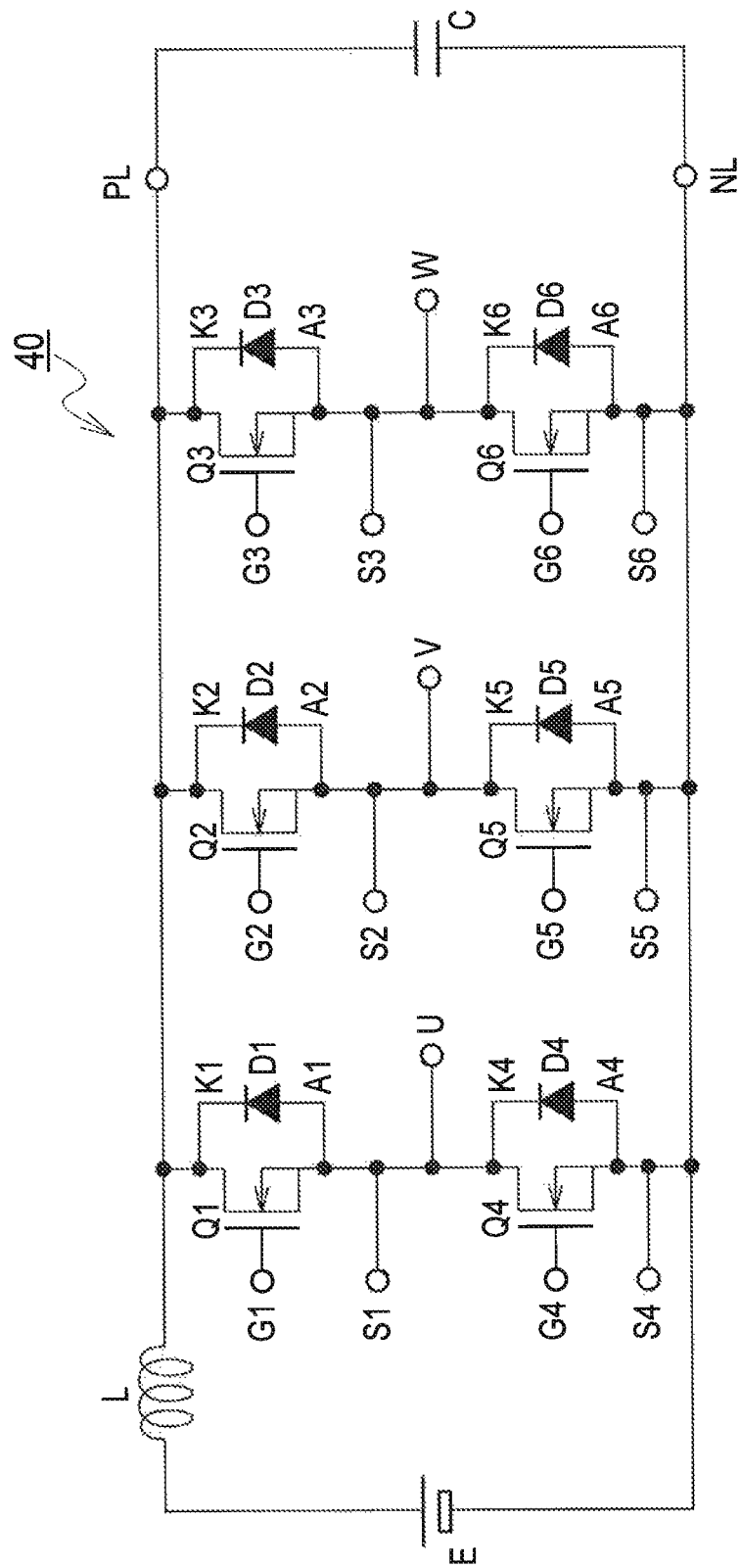
FIG. 22 shows an example of a circuit configuration in which a snubber capacitor is connected between a power terminal PL and an earth terminal (ground terminal) NL, in a schematic circuit configuration of a three-phase alternating current (AC) inverter composed using the power module according to the embodiment.

In the power module 20 according to the embodiment, FIG. 22 illustrates a circuit configuration to connect the snubber capacitor C between the power terminal PL and the earth terminal (ground terminal) NL. When connecting the power module 20 according to the embodiment to the power source E, large surge voltage Ldi/dt is produced by an inductance L included in a connection line due to a high switching speed of the SiC device. For example, the surge voltage Ldi/dt is expressed as follows: Ldi/dt=$3 \times 10^9$ (A/s), where a current change di=300 A, and a time variation accompanying switching dt=100 ns. Although a value of the surge voltage Ldi/dt changes dependent on a value of the inductance L, the surge voltage Ldi/dt is superimposed on the power source V. Such a surge voltage Ldi/dt can be absorbed by the snubber capacitor C connected between the power terminal PL and the earth terminal (ground terminal) NL.

(Application Examples for Applying Power Module)

Next, there will now be explained a three-phase AC inverter 40 composed by using the power module 20 according to the embodiment with reference to FIG. 23.

Figure 23:
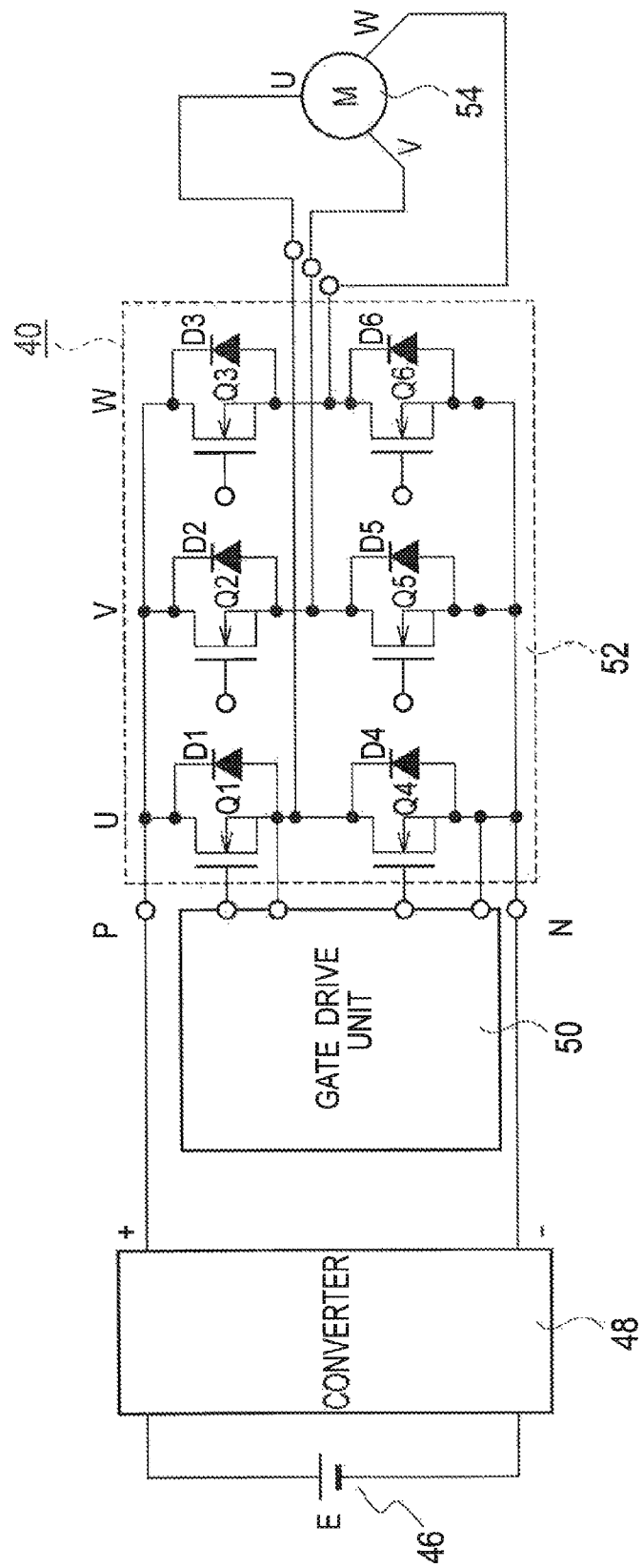
FIG. 23 is a schematic circuit configuration diagram of the three-phase AC inverter composed using the power module according to the embodiment.

As shown in FIG. 23, the three-phase AC inverter 40 includes: a gate drive unit 50; a power module unit 52 connected to the gate drive unit 50 and a three-phase AC motor unit 54. U-phase, V-phase, and W-phase inverters are respectively connected to the three-phase AC motor unit 54 so as to correspond to U phase, V phase, and W phase of the three-phase AC motor unit 54, in the power module unit 52. In this case, although the gate drive unit 50 is connected to the SiC MOSFETs Q1, Q4 as shown in FIG. 23, the gate drive unit 50 is similarly connected also to the SiC MOSFETs Q2, Q5 and the SiC MOSFETs Q3, Q6 (not shown in FIG. 23).

In the power module unit 52, the SiC MOSFETs Q1, Q4, and Q2, Q5, and Q3, Q6 having inverter configurations are connected between a positive terminal (+) and a negative terminal (−) to which the converter 48 in a storage battery (E) 46 is connected. Furthermore, diodes D1-D6 are connected inversely in parallel to one another between the source and the drain of the SiC-MOSFETs Q1 to Q6.

Although the structure of the single phase inverter corresponding to U phase portion of FIG. 23 has been explained in the power module 20 according to the embodiment, the three-phase power module unit 52 can also be formed also by similarly forming V phase and W phase inverters.

The power module according to the embodiment can be formed as any one of 1-in-1, 2-in-1, 4-in-1, or 6-in-1 module.

As explained above, according to the embodiment, there can be provided the power module with improved reliability so that the insulating layer and the metal layer may be hardly deviated from each other even if external force is applied thereon; and the fabrication method for such a power module.

[Other Embodiments]

As explained above, the embodiment has been described, as a disclosure including associated description and drawings to be construed as illustrative, not restrictive. This disclosure makes clear a variety of alternative embodiment, working examples, and operational techniques for those skilled in the art.

Such being the case, the embodiment covers a variety of embodiments, whether described or not.

Although the insulating layer 7 is formed also between the leadframes 1 and 5 in FIG. 5, the insulating layer 7 may not always be formed between the leadframes 1, 5, but may be formed only on a bottom surface of the leadframes 1, 5.

INDUSTRIAL APPLICABILITY

The power module according to the embodiment can be used for semiconductor modules, e.g. IGBT modules, diode modules, MOS modules (Si, SiC, GaN), etc. The power module according to the embodiment can also be used for structures which do not use insulating substrates, e.g. Direct Copper Bond (DBC) in case type modules.

What is claimed is:

1. A power module comprising:
an insulating layer having a top surface and a bottom surface;
a metal layer disposed on the top of the insulating layer;
a semiconductor chip disposed on the metal layer; and
a mold resin formed so as to cover the semiconductor chip, at least a part of the metal layer, and only the top surface side of the insulation layer, wherein
a groove into which a part of the insulating layer is inserted is formed on a surface of the metal layer facing the insulating layer, and the bottom surface of the insulation layer is a flat surface.

2. The power module according to claim 1, wherein a plurality of the groove are formed outside a region of the metal layer opposite to the semiconductor chip.

3. The power module according to claim 2, wherein the region is a region where an angle between a line and a flat surface of the metal layer is equal to or less than 45 degrees, the line connecting between an edge part of the semiconductor chip and an edge part of the groove nearest to the semiconductor chip among the plurality of the grooves.

4. The power module according to claim 2, wherein the plurality of the groove are formed only outside a region of the metal layer opposite to the semiconductor chip.

5. The power module according to claim 1, wherein:
a cross-sectional shape of the groove is at least one shape selected from the group consist of a rectangle shape, a semicircle shape, a semi-ellipse shape, triangular shape, and a wedge shape; and
a depth of the groove is shallower than a half of a thickness of the metal layer.

6. The power module according to claim 1, wherein the groove is formed along in one direction or is formed in a lattice-like shape.

7. The power module according to claim 1, wherein a surface roughening process is applied on a surface of the metal layer facing the insulating layer.

8. The power module according to claim 1, wherein the insulating layer is formed of a material softer than the metal layer.

9. The power module according to claim 8, wherein a hardness of the insulating layer is softer than A40 in durometer hardness.

10. The power module according to claim 1, wherein the insulating layer is formed of an organic material.

11. The power module according to claim 1, wherein the insulating layer is formed of a silicone based resin.

12. The power module according to claim 1, wherein the insulating layer is filled up with a high thermally-conductive filler.

13. The power module according to claim 12, wherein the filler is at least one selected from the group consist of aluminium oxide, silicon oxide, aluminum nitride, silicon nitride, boron nitride, beryllia, and magnesia.

14. The power module according to claim 1, wherein an edge part of the insulating layer is intervened between the mold resin and the metal layer.

15. The power module according to claim 1, wherein:
the semiconductor chip is formed of one selected from the group consist of an SiC based power device, a GaN based power device, and an AlN based power device; and
a current change rate di/dt thereof is larger than $3\times10^8$ (A/s).

16. The power module according to claim 1, wherein the power module is formed as any one selected from the group consist of 1-in-1 module, 2-in-1 module, 4-in-1 module, and 6-in-1 module.

17. The power module according to claim 1, wherein a distance between the adjacent grooves, and a width of each groove are approximately equal to each other.

* * * * *